United States Patent [19]

Ishiguro et al.

[11] Patent Number: 4,944,010
[45] Date of Patent: Jul. 24, 1990

[54] STEREO DEMODULATOR AND A DEMODULATING METHOD THEREOF

[75] Inventors: Kazuhisa Ishiguro; Mikio Yamagishi, both of Gunma, Japan

[73] Assignee: Sanyo Electric Co., Ltd., Osaka, Japan

[21] Appl. No.: 269,903

[22] Filed: Nov. 10, 1988

[30] Foreign Application Priority Data

Nov. 19, 1987 [JP] Japan .................................. 62-292440

[51] Int. Cl.⁵ ............................................. H04H 5/00
[52] U.S. Cl. ......................................................... 381/4
[58] Field of Search ........................... 381/2, 3, 4, 7, 13

[56] References Cited

U.S. PATENT DOCUMENTS 4,139,738 2/1979 Ienaka et al. ............................ 381/7
4,380,824 4/1983 Inoue .................................... 455/238

Primary Examiner—Forester W. Isen
Attorney, Agent, or Firm—Darby & Darby

[57] ABSTRACT

A stereo demodulator of a matrix system comprises: a first amplifier (23, 24, 25) for negative feedback amplification of a stereophonic composite signal, a first voltage-current converter (26) for detecting a current-form stereophonic sum signal responsive to a voltage output of the first amplifier, a non-inversion amplifier (27) for negative feedback non-inversion amplification of the stereophonic composite signal, an inversion amplifier (28) for negative feedback inversion amplification of the stereophonic composite signal, a second voltage-current converter (29, 38) for outputting a first current-form stereophonic subchannel signal responsive to a voltage output of the non-inversion amplifier (27), a third voltage-current converter (30, 39) for supplying a current-form signal stereophonic subchannel signal responsive to a voltage output from the inversion amplifier (28), a difference signal demodulator (31) for providing stereophonic difference signals of opposite phases in the form of current signals from the outputs of the second and third voltage-current converters, and an matrix circuit (41) for performing matrix processing on the received stereophonic sum signal from the first voltage-current converter and the stereophonic difference signals from the difference signal demodulator (31) and outputting right and left stereophonic signals in a voltage signal form.

10 Claims, 4 Drawing Sheets

STEREO DEMODULATOR AND A DEMODULATING METHOD THEREOF

BACKGROUND OF THE INVENTION

1. Field of the Invention

The present invention relates to a stereo demodulator and a demodulating method thereof and particularly to a stereo demodulator and a demodulating method thereof for demodulating right and left stereophonic signals from a stereophonic composite signal of a pilot tone system transmitted by FM (frequency modulation) radio broadcasting.

2. Description of the Prior Art

An FM stereophonic broadcasting system is known as a broadcasting system for reproducing an audio signal having three-dimensional ranges.

One of the FM stereophonic broadcasting systems is a pilot tone system (a suppressed-carrier AM-FM system) for transmitting a signal having a frequency spectrum as shown in FIG. 1.

Referring to FIG. 1, a stereophonic signal of a pilot tone system includes a main channel of a frequency band of 15 kHz or less and a subchannel of a frequency band of 23 kHz to 53 kHz. A sum signal (L+R) is allotted to the main channel. In the sum signal, the L signal represents a left stereophonic signal and the R signal represents a right stereophonic signal. The subchannel transmits a suppressed-carrier modulated wave (a double side band wave of 38 kHz as a carrier) based on a difference signal (L−R). A pilot signal of a frequency of 19 kHz, i.e., ½ of 38 kHz is added for the purposes of identification of a monophonic or stereophonic broadcasting signal and compatible demodulation of the monophonic/stereophonic broadcasting signal. The main channel, the subchannel and the pilot signal are transmitted in a form in which those signals are frequency divided and multiplexed as one radio wave (a main carrier). This multiplexed signal is called a stereophonic composite signal, which is represented by the following equation.

$$A(t) = (L+R) + (L-R)\cos \omega t + P \cos (\omega t/2)$$

where L and R represent respective amplitudes of the L signal and the R signal, $\omega$ represents an angular frequency of the subcarrier and P represents an amplitude of the pilot signal.

This stereophonic composite signal is received by an FM receiver. The stereophonic composite signal obtained at an output of an FM detecting circuit included in the FM receiver is demodulated by a stereo demodulator as shown in FIG. 2.

Referring to FIG. 2, a signal input stage of the FM receiver includes a radio-frequency amplifier 101, a frequency converting/intermediate frequency amplifier 102 and an FM detector 103. The FM detector 103 outputs a desired stereophonic composite signal from an amplified intermediate frequency signal.

The stereo demodulator comprises a composite signal amplifier 401 for amplifying a composite signal from the FM detector, a subchannel demodulator 405 and a PLL (phase-locked loop) 407 for providing two kinds of difference signals, and matrix circuits 408 and 409 for providing an L signal and an R signal.

The output composite signal of the composite signal amplifier 401 is supplied to a separation adjuster 403. The separation adjuster 403 adjusts a magnitude of the sum signal (L+R) contained in the composite signal supplied thereto, thereby to adjust separation between the sum signal and the difference signals, that is, separation between the right and left stereophonic signals.

The PLL 407 provides a reproduced subcarrier of 38 kHz in phase locked with that of the pilot signal in the composite signal.

The subchannel demodulator 405 demodulates a difference signal of a positive polarity (L−R) and a difference signal of a negative polarity −(L−R) by using a carrier-suppressed double side band (DSB) signal from the composite signal amplifier 401 and the reproduced subcarrier from the PLL 407.

The matrix circuit 408 receives the sum signal (L+R) from the separation adjuster 403 and the difference signal (L−R) from the subchannel demodulator 405 and performs matrix processing, that is, addition, so as to provide the left stereophonic signal L. The matrix circuit 409 performs matrix processing of the sum signal (L+R) and the negative difference signal −(L−R) and provides the right stereophonic signal R.

The left and right stereophonic signals L and R from the matrix circuits 408 and 409 are supplied to de-emphasis circuits 410 and 411, respectively, where those signals are de-emphasized and unnecessary high-frequency components are removed therefrom.

In the above described construction, at the time of receiving a monophonic broadcast, a monophonic signal is transmitted by the main channel but a stereophonic subchannel signal and a pilot signal are not transmitted. Accordingly, the same monophonic signal (L+R) is obtained from the outputs of the de-emphasis circuits 410 and 411.

FIG. 3 is a circuit diagram showing an example of a concrete construction of the above described stereo demodulator, which is indicated for example in "'85 Sanyo Semiconductor Handbook, Monolithic Bipolar Integrated Circuits", page 360, issued Mar. 20, 1985.

Referring to FIG. 3, the stereo demodulator comprises an amplifier 2 for amplifying a stereophonic composite signal supplied through an input terminal 1, a block 50 for providing a sum signal (L+R), a block 60 for providing two kinds of difference signals (L−R) and −(L−R), a matrix circuit 90 for performing matrix processing of the sum signal and the difference signals from the blocks 50 and 60 to provide right and left stereophonic signals R and L, and an output circuit 80 for receiving the output of the matrix circuit 90 and providing the same to a succeeding stage, for example, a low-frequency amplifier (not shown).

The sum signal circuit block 50 comprises npn bipolar transistors 7 and 8 receiving the stereophonic composite signal from the amplifier 2 at their bases and generating the sum signal (L+R) at their collectors. The transistor 7 has its collector connected to a node N1 and its emitter connected to a ground potential through a resistor R1 and a variable resistor R3. The transistor 8 has its collector connected to a node N2 and its emitter connected to the ground potential through resistors R2 and R3. The variable resistor R3 together with the resistors R1 and R2 adjust the gains of the transistors 7 and 8.

The difference signal demodulating circuit block 60 comprises a first differential circuit 3 for receiving the stereophonic composite signal from the amplifier 2 as an input signal, a PLL circuit 14 for providing a switching signal of 38 kHz in phase locked with that of the pilot signal of 19 kHz and second and third differential circuits 4 and 5 for demodulating the difference signals according to the output of the first differential circuit 3 in response to the switching signal from the PLL circuit 14.

The first differential circuit 3 comprises npn bipolar transistors 12 and 13. The transistor 12 has its base connected to an output of the amplifier 2, its emitter connected to a constant current source 21 through a resistor 10 and its collector outputting an inverted signal of the output of the amplifier 2. The transistor 13 has its base connected to a reference bias power supply +B, its emitter connected to the constant current source 21 through a resistor 11 and its collector for generating a non-inverted signal of the output from the amplifier 2.

The second differential circuit 4 comprises npn bipolar transistors 15 and 16. The transistor 15 has its base receiving a signal of 38 kHz of a first polarity from the PLL circuit 14, its emitter connected to the transistor 12 and its collector connected to the node N1. The transistor 16 has its base receiving a switching signal of 38 kHz of a second polarity from the PLL circuit 14, its emitter connected to the collector of the transistor 12 and its collector connected to the node N2. The switching signals of the first and second polarities from the PLL circuit 14 have opposite phases, namely, the phases different with each other by 180°. The second differential circuit 4 multiplies the switching signal from the PLL circuit 4 by the collector output of the transistor 12 of the first differential circuit 3 and outputs the result of the multiplication. Accordingly, if the difference signal −(L−R) is generated at the collector output of the transistor 15, the difference signal (L−R) of the opposite phase is provided at the collector output of the transistor 16.

The third differential circuit 5 comprises npn bipolar transistors 17 and 18. The transistor 17 has its base receiving the switching signal of the second polarity from the PLL circuit 14, its emitter connected to the collector of the transistor 13 and its collector connected to the node N1. The transistor 18 has its base receiving the switching signal of the first polarity from the PLL circuit 14, its emitter connected to the collector of the transistor 13 and its collector connected to the node N2. Accordingly, in the same manner as in the second differential circuit 4, the collectors of the transistors 17 and 18 provide the difference signals of the opposite phases. According to the above described example, the difference signal −(L−R) is provided at the collector output of the transistor 17 and the difference signal (L−R) is provided at the collector output of the transistor 18.

The matrix circuit 90 performs matrix processing, namely, addition of the sum signal (L+R) from the sum signal circuit block 50 and the two difference signals (L−R) and −(L−R) from the difference signal demodulating circuit block 60, thereby to provide right and left stereophonic signals R and L.

The output circuit block 80 comprises two current mirror circuits. The first current mirror circuit comprises pnp bipolar transistors Tr1 and Tr2. The transistor Tr2 has its base and collector connected to the node N1 and its emitter connected to a power supply potential +Vcc. The transistor Tr1 has its emitter connected to the power supply potential +Vcc, its base connected to the node N1 and its collector connected to an output terminal 19. The output terminal 19 is provided with a resistor R4 for converting collector current of the transistor Tr1 to a voltage signal. In the first current mirror circuit, collector current equal to the collector current of the transistor Tr2 flows through the transistor Tr1.

The second current mirror circuit comprises a diode-connected pnp bipolar transistor Tr3 and a pnp bipolar transistor Tr4 for output. The transistor Tr3 has its base and collector connected to the node N2 and its emitter connected to the power supply potential +Vcc. The transistor Tr4 has its emitter connected to the power supply potential +Vcc, its base connected to the node N2 and its collector connected to an output terminal 20. The output terminal 20 is connected with a resistor R5 for current-voltage conversion. The resistor R5 is connected between the output terminal 20 and the ground potential. Also in the second current mirror circuit, equal collector current flows in the transistors Tr3 and Tr4.

Now, operation will be briefly described.

The transistors 7 and 8 receive the stereophonic composite signal from the amplifier 2 at their respective bases and generate the sum signal (L+R) of the main channel at their respective collectors. The first differential circuit 3 receives the output from the amplifier 2 at the base of the transistor 12. The emitters of the transistors 12 and 13 are connected to the constant current source 21 through the resistors 10 and 11, respectively and the base of the transistor 13 is connected to the reference bias power supply +B. When no signal is applied, the base voltages of the transistors 12 and 13 of the first differential circuit 3 are equal to each other and the respective emitter currents thereof are also equal to each other. When the stereophonic composite signal from the amplifier 2 becomes larger than the reference voltage +B, the emitter current i1, namely, the collector current of the transistor 12 increases. In the opposite case, the emitter current i1 of the transistor 12 (the collector current) decreases. The sum of the emitter currents of the transistors 12 and 13 is equal to a constant current I flowing in the constant current source 21. Consequently, the collectors of the transistors 12 and 13 provide, as the collector currents, subchannel subcarrier-suppressed difference signal components of opposite phases.

In the second and third differential circuits 4 and 5, the signals of 38 kHz of the opposite phases are supplied from the PLL circuit 14 to the respective bases of the transistors 15 and 18, and 16 and 17. Accordingly, the transistors 15 and 18 are simultaneously turned on and, on the other hand, the transistors 16 and 17 are simultaneously turned on. The conduction of the transistors 15 and 18 and the conduction of the transistors 16 and 17 occur alternately. The emitters of the transistors 15 and 16 are connected to the collector of the transistor 12, while the emitters of the transistors 17 and 18 are connected to the collector of the transistor 13. Accordingly, in the second and third differential circuits, the opposite difference signals (L−R) and −(L−R) are generated at the collectors of the transistors simultaneously turned on. The second and third differential circuits demodulate the two difference signals by multiplying the switching signal from the PLL circuit 14 by the output of the first differential circuit 3.

The matrix circuit 90 performs addition of the sum signal and the difference signals supplied to the nodes N1 and N2. As a result, the left and right stereophonic signals L and R are generated at the nodes N1 and N2 in the form of current signals.

In the output circuit 80, collector currents equal to those of the transistors Tr2 and Tr3 are generated at the collectors of the transistors Tr1 and Tr4, respectively. The collector currents of the transistors Tr1 and Tr4 are converted to voltage signals by the resistors R4 and R5, respectively, and the converted signals are outputted as the left stereophonic signal L and the right stereophonic signal R from the output terminals 19 and 20, respectively.

In the above described conventional stereo demodulator, the transistors 7, 8, 12 and 13 in the input stage are adapted to operate in a linear region by application of voltage. However, the $V_{BE}-I_C$ characteristic of the transistors exhibit non-linear rising characteristics. More specifically, a region near the cut-off region of the transistors exhibit characteristic curves greatly deviated from a straight line. In consequence, a non-linear distortion occurs in the base-emitter voltage of each of the transistors 7, 8, 12 and 13, which causes deterioration of linearity of the stereo demodulator, that is, deterioration of a distortion factor, making it difficult to reproduce the right and left stereophonic signals correctly.

In order to operate the first differential circuit 3 in the linear region, the maximum level of the input signal applied to the base of the transistor 12 should be limited. Accordingly, the dynamic range is limited, and the input signal level range providing a good S/N (signal-to-noise) ratio is also restricted. For example, assuming that the reference DC voltage +B applied to the base of the transistor 13 is +3V, that the values of the emitter resistors 10 and 11 are both 1 kΩ, and that the constant current I flowing in the constant current source 21 is 1 mA, the maximum level of the input signal is $1V_p$ (700Vrms) with respect to the DC voltage +B as a reference voltage and if a larger signal is applied, deterioration of the S/N ratio can not be avoided.

SUMMARY OF THE INVENTION

An object of the present invention is to provide a stereo demodulator making it possible to eliminate the above described disadvantages of the conventional stereo demodulator.

More specifically, the object of the present invention is to provide a stereo demodulator capable of increasing a maximum input signal level without deteriorating a distortion factor.

Another object of the present invention is to provide a stereo demodulating method of a matrix system making it possible to increase a maximum input signal level without deteriorating a distortion factor.

A further object of the present invention is to provide a stereo receiver having excellent dynamic range and S/N ratio.

A stereo demodulator according to the present invention comprises: a first amplifier for negative feedback amplification of an FM detected stereophonic composite signal, a sum signal detector for receiving an output of the first amplifier and detecting an output stereophonic sum signal in the form of a current signal, a subchannel detector for performing negative feedback amplification of the FM detected stereophonic composite signal and detecting and outputting a subchannel signal in the form of a current signal, a difference signal demodulator for receiving the current output of the subchannel detector, demodulating a stereophonic difference signal by multiplying the output by a signal of the same frequency as that of a subcarrier signal locked in phase with a pilot signal and outputting the demodulated difference signal in the form of a current signal, and a matrix circuitry for performing matrix processing of the current output of the sum signal detector and the current output of the difference signal demodulator to form right and left stereophonic signals.

In the stereo demodulator according to the present invention, after negative feedback amplification of a stereophonic composite signal, a stereophonic sum signal and a stereophonic subchannel signal are detected. Accordingly, non-linear distortion occurring at the time of detection of signals is suppressed and the distortion factor is improved. In addition, since the difference signal demodulator receives the subchannel signal in the current mode, the maximum level of the input signal of the subchannel detecting circuit is less limited and thus the stereo demodulator of the present invention has improved dynamic range and S/N ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
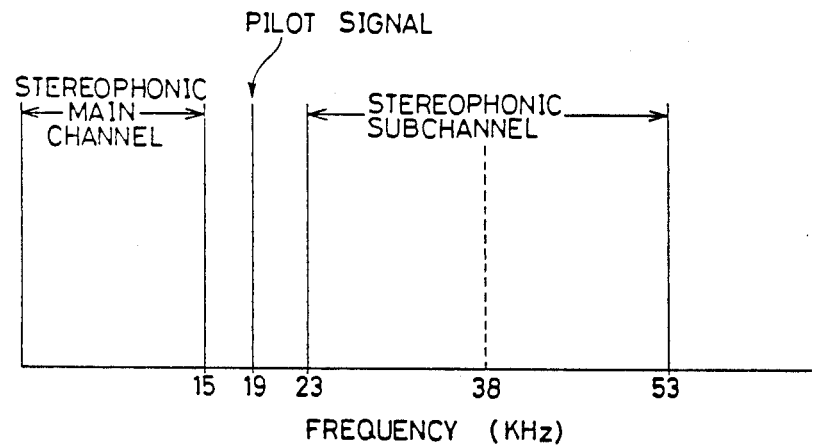
FIG. 1 shows a frequency spectrum of a stereophonic composite signal of a pilot tone system.
Figure 2:
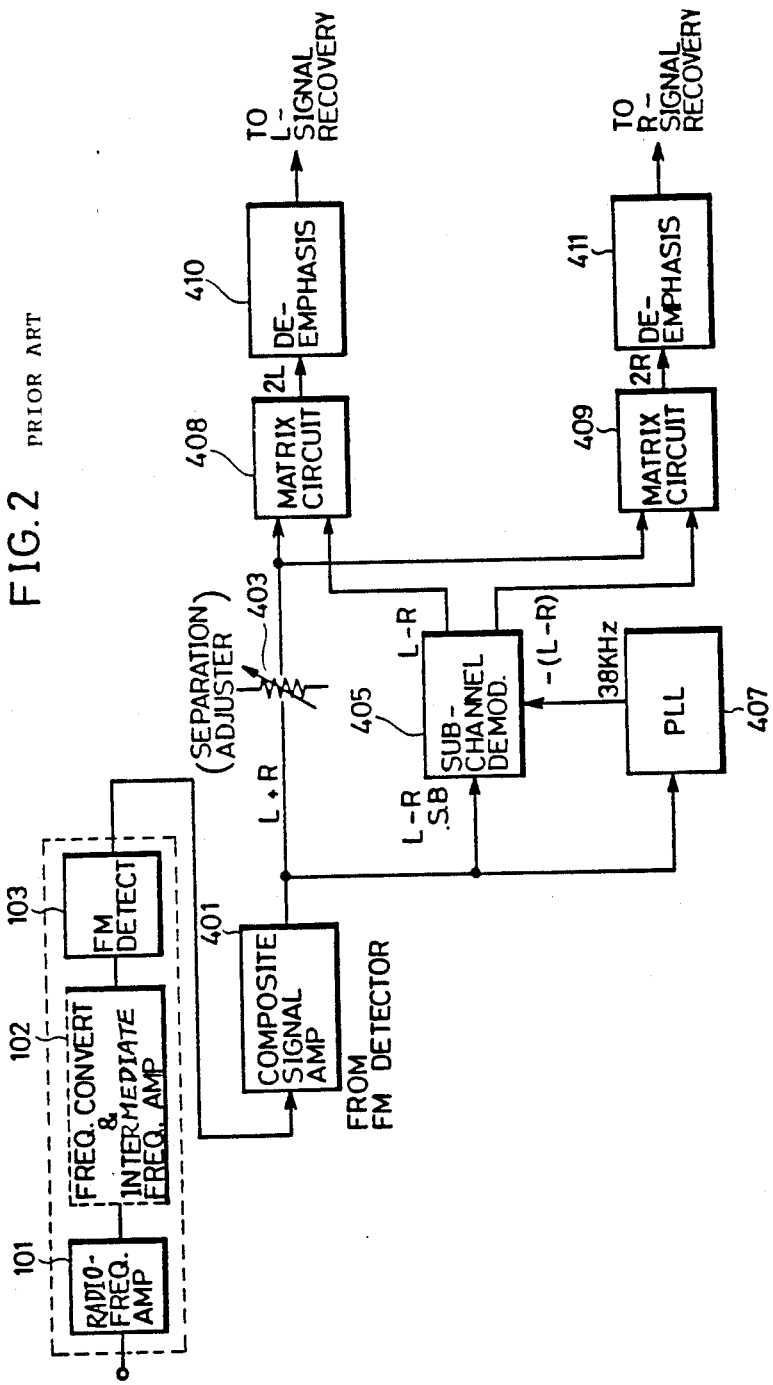
FIG. 2 is a block diagram showing a schematic construction of a stereo demodulator.
Figure 3:
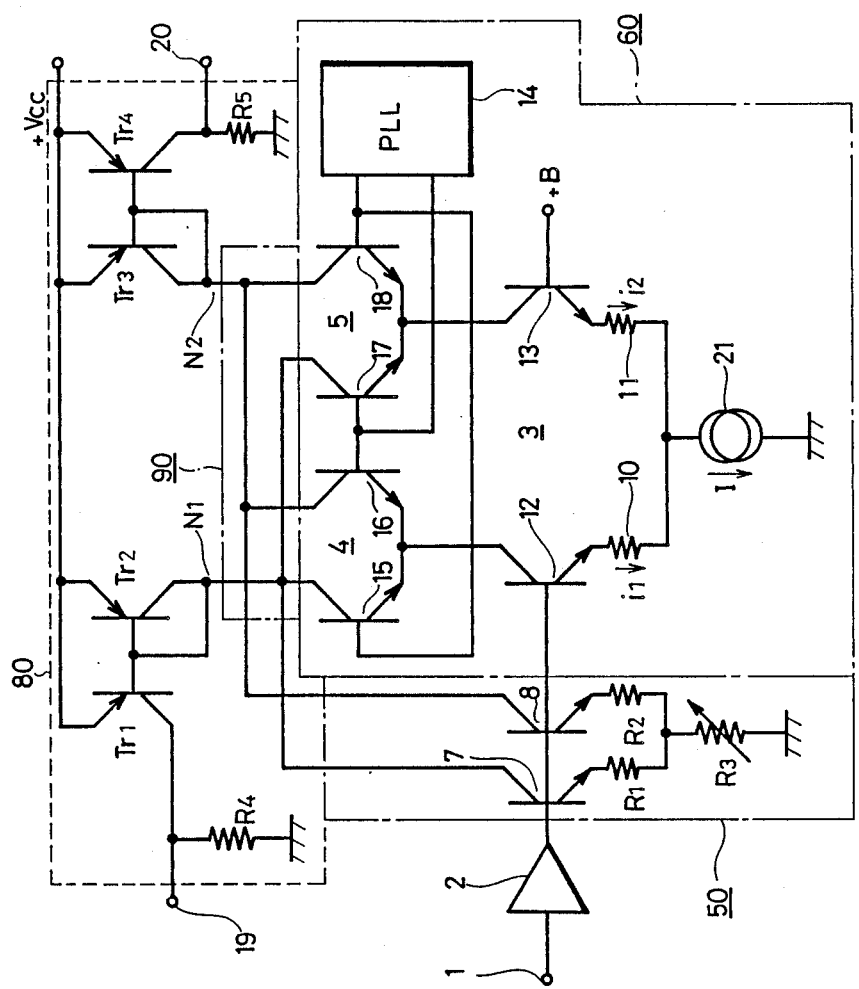
FIG. 3 is a circuit diagram showing a specified construction example of a conventional stereo demodulator.
Figure 4:
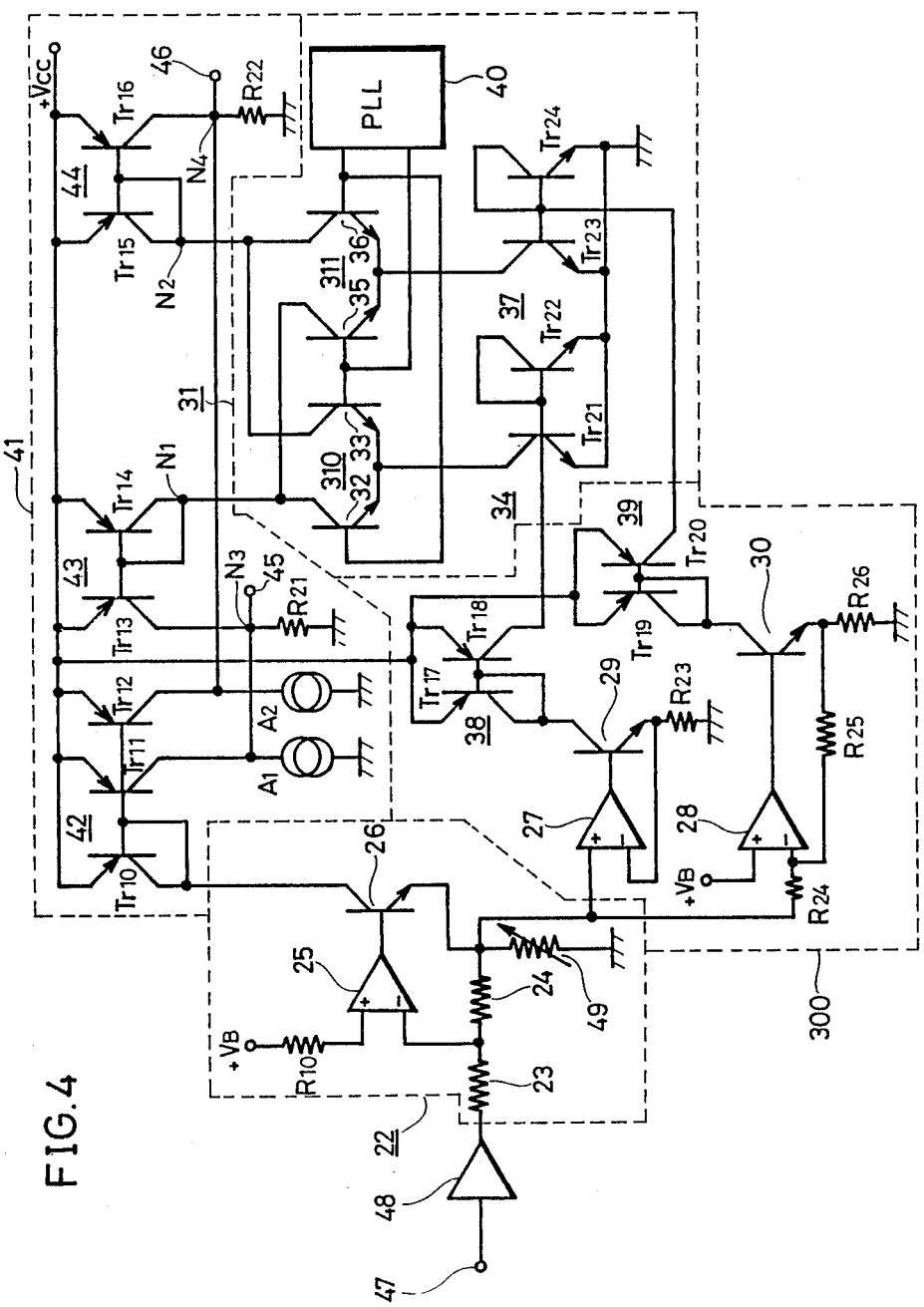
FIG. 4 is a circuit diagram showing a construction of a stereo demodulator according to an embodiment of the present invention.

FIG. 4 is a circuit diagram showing a construction of a stereo demodulator of a matrix system according to an embodiment of the invention. Referring to FIG. 4, the stereo demodulator comprises: a preamplifier 48 for amplifying a stereophonic composite signal applied through an input terminal 47, a main channel output circuit 22 for amplifying, with negative feedback, the stereophonic composite signal from the preamplifier 48 and outputting a sum signal (L+R) of a main channel in the form of a current signal, a subchannel signal detecting circuit 300 for amplifying with negative feedback the stereophonic composite signal negative-feedback amplified in the main channel output circuit 22 and detecting a stereophonic subchannel signal in the form of a current signal, a difference signal demodulating circuit 31 for demodulating two kinds of difference signals (L−R) and −(L−R) upon receipt of a carrier-suppressed DSB signal from the detecting circuit 300, and a matrix circuit 41 for performing matrix processing (addition) of the sum signal received from the main channel output circuit 22 and the difference signals received from the difference signal demodulating circuit 31 and providing right and left stereophonic signals R and L.

The main channel output circuit 22 comprises an input resistor 23 for receiving an output of a preamplifier 48, an operational amplifier 25 for amplifying, by inversion, a signal voltage supplied thereto through the input resistor 23 using a reference voltage $+V_B$ as a reference value, a voltage-current (V−I) converting transistor 26 for converting an output voltage signal from the amplifier 25 to a current signal, a resistor 24 for feeding back the output of the amplifier 25 to an inversion input, and a variable load resistor 49 for adjusting a rate of conversion from voltage to current. The amplifier 25 has its non-inversion input connected to the reference power supply potential $+V_B$ through an offset voltage adjusting resistor R10 and its inversion input connected to a point of connection of the resistors 23 and 24. The V−I converting npn bipolar transistor 26 has its base connected to the output of the amplifier 25, its emitter connected to the ground potential through the load resistor 49 and its connector for generating a sum signal (L+R) in the form of a current signal. The negative feedback resistor 24 is connected between the emitter of the transistor 26 and the inversion input of the amplifier 25, thereby to form a negative feedback loop of the amplifier 25.

The subchannel signal detecting circuit 300 comprises: a non-inversion amplifier 27 for amplifying, without inversion, the voltage signal amplified by the negative feedback amplifier 25 (more precisely, the emitter voltage of the V−I converting transistor 26), a second V−I converting npn bipolar transistor 29 for converting the voltage output signal from the non-inversion amplifier 27 to an electric current, an inversion amplifier 28 for amplifying, with inversion, the output voltage signal from the amplifier 25, a third V−I converting npn bipolar transistor 30 for converting the output voltage signal from the inversion amplifier 28 to a current signal, and first and second current mirror circuits 38 and 39 for outputting current signals equal to the output current signals of the second and third V−I converting transistors 29 and 30, respectively. The amplifier 27 has its non-inversion input connected to the emitter of the first V−I converting transistor 26, its output connected to the base of the second V−I converting transistor 29 and its inversion input connected to the emitter of the transistor 29. The emitter of the second V−I converting transistor 29 is also connected to the ground potential through a load resistor R23. The amplifier 27 is operated by a voltage follower to enable the transistor 29. The transistor 29 generates, at its collector, a current signal corresponding to the output voltage signal from the amplifier 27. The inversion amplifier 28 has its non-inversion input connected to the reference potential $+V_B$ and its inversion input connected to the emitter of the first V−I converting transistor 26 through an input resistor R24. The transistor 30 has its base connected to an output of the inversion amplifier 28 and its emitter connected to the inversion input of the amplifier 28 through a negative feedback resistor R25 and also connected to the ground potential through a load resistor R26. The transistor 30 generates, at its collector, a current signal corresponding to the voltage output signal from the inversion amplifier 28. The amplifiers 27 and 28 is constructed by operational amplifiers.

The first current mirror circuit 38 comprises an input transistor Tr17 in diode connection and an output transistor Tr18. The pnp transistor Tr17 has its base and collector connected to the collector of the transistor 29 and its emitter connected to an operation power supply potential +Vcc. The pnp bipolar transistor Tr18 has its emitter connected to the power supply potential +Vcc, its base connected to the base of the transistor Tr17 and its collector for generating a collector current equal to the collector current of the transistor 29.

The second current mirror circuit 39 comprises an input transistor Tr19 in diode connection and an output transistor Tr20 for outputting a subchannel signal. The pnp bipolar transistor Tr19 has its emitter connected to the operation power supply potential +Vcc and its base and collector connected to the collector of the transistor 30. The pnp bipolar transistor Tr20 has its emitter connected to the operation power supply potential +Vcc, its base connected to the base of the transistor Tr21 and its collector for providing a collector current, namely, a subchannel signal, equal in value to the collector current of the transistor 30.

The amplifiers 27 and 28 both have a gain of 1. The current mirror circuits 38 and 39 provide DSB signals of the opposite phases in the form of current signals.

The difference signal demodulating circuit 31 comprises third and fourth current mirror circuits 34 and 37, first and second differential circuit 310 and 311, and a PLL circuit 40.

The third current mirror circuit 34 comprises an npn bipolar transistor Tr21 and an npn bipolar transistor Tr22. The transistor Tr21 has its base connected to the collector of the transistor Tr18, its emitter connected to the ground potential and its collector for generating a current signal corresponding to the collector current of the transistor Tr18. The transistor Tr22 has its base and collector connected to the base of the transistor Tr21 and its emitter connected to the ground potential. The transistor Tr22 is biased between its base and emitter in response to the collector current through the transistor Tr18, to cause a flow of a collector current equal to the collector current of the transistor Tr18. Since the base-emitter voltage of the transistor Tr22 becomes the base-emitter voltage of the transistor Tr21, a collector current equal to the collector current of the transistor Tr18 is generated in the transistor Tr21.

The fourth current mirror circuit 37 comprises an npn bipolar transistor Tr23 and a diode-connected npn bipolar transistor Tr24. The transistor Tr23 has its base connected to the collector of the transistor Tr20 and its emitter connected to the ground potential. The transistor Tr24 has its base and collector connected to the base of the transistor Tr23 and the collector of the transistor Tr20 and its emitter connected to the ground potential. The transistor Tr23 generates, at its collector, a collector current equal to the collector current of the transistor Tr20 as a result of current mirror operation of the transistor Tr24.

The PLL circuit 40 detects a pilot signal of 19 kHz contained in the stereophonic composite signal and supplies two kinds of switching signals of 38 kHz in phase locked with that of the pilot signal. Those two kinds of switching signals form a two opposite phase, non-overlapping switching signal.

The first differential circuit 310 comprises npn bipolar transistors 32 and 33 which operate differentially in response to the switching signals from the PLL circuit 40. The emitters of the transistors 32 and 33 are connected in common with the collector of the transistor Tr21. The switching signals of the opposite phases from the PLL circuit 40 are applied to the bases of the transistors 32 and 33. Accordingly, when the transistor 32 is in the on state, the transistor 33 is in the off state.

The second differential circuit 311 comprises npn bipolar transistors 35 and 36 which operate differentially in response to the switching signals of the two phases (different from each other by 180°) from the PLL circuit 40. The transistors 35 and 36 have their emitters connected in common to the collector of the transistor Tr23.

The transistors 32 and 35 have their collectors connected to the node N1. The transistors 33 and 36 have their collectors connected to the node N2. The respective transistors 32, 33, 35 and 36 perform multiplication of the switching signal of 38 kHz from the PLL circuit 40 and the respective outputs of the current mirror circuits 34 and 37. Accordingly, current signals corresponding to the difference signals of the opposite phases, (L−R) and −(L−R), are generated at the nodes N1 and N2.

The matrix circuit 41 for providing the right and left stereophonic signals from the sum signal and the difference signals comprises fifth, sixth and seventh current mirror circuits 42, 43 and 44.

The fifth current mirror circuit 42 comprises a diode-connected pnp bipolar transistor Tr10, and pnp bipolar transistors Tr11 and Tr12 having their collectors connected to constant current sources A1 and A2, respectively. The transistor Tr10 has its emitter connected to the operation power supply potential +Vcc and its base and collector connected to the collector of the transistor 26. The transistor Tr11 has its emitter connected to the operation power supply potential +Vcc, its base connected to the base of the transistor Tr10 and its collector connected not only to the constant current source A1 but also to an output terminal 45. The transistor Tr12 has its emitter connected to the operation power supply potential +Vcc, its base connected to the bases of the transistors Tr10 and Tr11 and its collector connected not only to the constant current source A2 but also to an output terminal 46.

The sixth current mirror circuit 43 comprises an output transistor Tr13 and a diode-connected input transistor Tr14. The pnp bipolar transistor Tr13 has its emitter connected to the operation power supply potential Vcc and its collector connected to the output terminal 45. The pnp bipolar transistor Tr14 has its emitter connected to the operation power supply potential +Vcc and its base and collector connected not only to the base of the transistor Tr13 but also to the node N1.

The seventh current mirror circuit 44 comprises a diode-connected input transistor Tr15 and an output transistor Tr16. The pnp bipolar transistor Tr15 has its emitter connected to the operation power supply potential and its base and collector connected not only to the base of the transistor Tr16 but also to the node N2. The pnp bipolar transistor Tr16 has its emitter connected to the operation power supply potential +Vcc and its collector connected to the output terminal 46.

The output terminals 45 and 46 are provided with load resistors R21 and R22, respectively, for converting a current signal to a voltage signal, in parallel with the constant current sources A1 and A2, respectively. The output terminals 45 and 46 provide the demodulated left and right stereophonic signals L and R. Which output terminal provides the R signal or the L signal is determined dependent on the polarities of the switching signals outputted from the PLL circuit 40. In the following, operation will be described.

A stereophonic composite signal applied to the input terminal 47 is amplified by the preamplifier 48 and after that it is amplified with negative feedback in a negative feedback amplifying portion including the inversion amplifier 25, the input resistor 23 and the negative feedback resistor 24. Assuming that no stereophonic composite signal is applied, the emitter voltage of the transistor 26 is equal to the reference voltage $+V_B$. When the stereophonic composite signal is supplied from the preamplifier 48, the emitter voltage of the transistor 26 changes dependent on the stereophonic composite signal thus supplied. The changed emitter voltage is fed back to the inversion input of the inversion amplifier 25 through the negative feedback resistor 24. The inversion amplifier 25 enables the transistor 26, while negative feedback is applied to the output of the inversion amplifier 25 by the emitter voltage of the transistor 26. As a result, the input/output characteristic of the amplifier 25, that is, the non-linearity (linear distortion) of the base-emitter voltage $V_{BE}$ of the transistor 26 is mitigated and the distortion factor is improved. The transistor 26 converts the output of the negative feedback inversion amplifier 25 to a current signal and generates a sum signal of the main channel at its collector. On the other hand, the transistor 26 generates, at its emitter, a stereophonic composite signal amplified with negative feedback. Assuming that the reference potential $+V_B$ is 3V, that the resistance value of the negative feedback resistor 24 is 20 kΩ, and that the resistance value of the load resistor 49 is 5 kΩ, a terminal voltage of the load resistor 49, that is, the emitter voltage of the transistor 26 is about 2.4Vp (peak) or about 1.7Vrms. The peak value is considerably larger than the maximum input level 700mVrms (1Vp) of the conventional apparatus and thus the dynamic range and the S/N ratio are improved. The stereophonic composite signal thus amplified with negative feedback is supplied to the subchannel signal detecting circuit 300. The negative feedback non-inversion amplifier 27 performs negative feedback non-inversion amplification of the signal supplied and applies the output thus obtained to the base of the transistor 29. The transistor 29 converts the output voltage of the amplifier 27 to a current signal and generates, at its collector, a signal corresponding to the subchannel signal. Similarly, the negative feedback inversion amplifier 28 further performs negative feedback inversion amplification of the stereophonic composite signal obtained by the negative feedback inversion amplification and supplies the output thus obtained to the base of the transistor 29. The transistor 29 converts the output voltage signal from the amplifier 28 to a current signal and generates, at its collector, a stereophonic subchannel signal. The amplifier 27 performs non-inversion amplification, while the amplifier 28 performs inversion amplification. Consequently, the current signals generated at the respective collectors of the transistors 29 and 30 are subchannel signals of the opposite phases. In addition, since the transistors 29 and 30 are enabled by the negative feedback amplifiers 27 and 28, respectively, the non-linear distortion in the base-emitter voltage is mitigated and thus the detecting circuit provides an excellent linearity.

The collector currents of the transistors 29 and 30 are supplied stably and correctly to the difference signal demodulating circuit 31 through the current mirror circuits 38 and 39, respectively. The difference signal demodulating circuit 31 receives the supplied current signals through the current mirror circuits 34 and 37. More specifically, the current output signal from the first current mirror circuit 38 is supplied to the third current mirror circuit 34 and the current output signal from the second current mirror circuit 39 is supplied to the fourth current mirror circuit 37. Accordingly, in the difference signal demodulating circuit 31, the input signals are applied in the current mode and therefore the problem of limitation of the maximum input level at the time of receiving an input signal in the voltage mode does not occur and unnecessary limitation is not imposed to the input voltage level.

The current signals supplied to the third and fourth current mirror circuits 34 and 37 are outputted as an equal output signal at the respective collectors of the transistors Tr21 and Tr23. The output signals of the current mirror circuits 34 and 37 are multiplied by the corresponding switching signal of 38 kHz from the PL circuit 40 in the same manner as in the prior art. As a result, current signals corresponding to the stereophonic difference signals (L−R) and −(L−R) are supplied to the output nodes N1 and N2 of the difference signal demodulating circuit 31.

In the matrix circuit 41, a current signal corresponding to the stereophonic sum signal (L+R) is provided from the transistors Tr11 and Tr12 of the current mirror circuit 42. A current signal equal to the current signal corresponding to the stereophonic difference signal supplied to the node N1 is provided from the collector of the transistor Tr13 of the current mirror circuit 43. A current signal equal to the current signal corresponding to the stereophonic difference signal supplied to the node N2 is provided to the transistor Tr16 of the current mirror circuit 44. As a result, matrix processing (addition) of the stereophonic sum signal (L+R) and the stereophonic difference signals (L−R) and −(L−R) is performed at the nodes N3 and N4, whereby one of the right and left stereophonic signals R and L is provided at the output terminal 45 and the other stereophonic signal is provided at the output terminal 46. In this embodiment, conversion from a current mode signal to a voltage mode signal is effected by the resistors R21 and R22. Each constant current sources A1 and A2 apply a bias for setting a reference level to an output signal.

The right and left stereophonic signals outputted from the output terminal 45 and 46 are de-emphasized for high-frequency attenuation and amplified by a low-frequency amplifying circuit subsequently provided. Then, the signals are supplied to the right and left speakers (not shown) and reproduced as independent right and left stereophonic signals.

If the pilot signal is not applied, the difference signal (L−R) is not transmitted and the PLL circuit 40 does not generate a switching signal. Accordingly, only the sum signal (L+R) is provided from the output terminals 45 and 46.

As described in the foregoing, according to the present invention, a stereophonic composite signal is first amplified with negative feedback and then it is subjected to voltage-current conversion so as to be supplied to the difference signal demodulating circuit. Consequently, non-linear distortion of the signal detecting transistors is suppressed by negative feedback operation and thus the stereo demodulating circuit having an excellent distortion factor is obtained. In addition, since the difference signal demodulating circuit is operated in the current mode, unnecessary level limitation of an input signal can be eliminated as is different from a conventional voltage mode drive system and it is made possible to increase the maximum input signal level. Consequently, the dynamic range can be increased and the S/N ratio can be improved. Thus, it is made possible to provide a stereo demodulating circuit having excellent characteristics and to provide a stereo receiver of excellent characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stereo demodulator for demodulating right and left stereophonic signals from an FM-detected stereophonic composite signal, said stereophonic composite signal including, in a frequency divisionally multiplexed form, a main channel of a sum signal obtained by addition of said right and left stereophonic signals and a subchannel of a carrier-suppressed modulated difference signal obtained by subtraction of said right and left stereophonic signals, said stereo demodulator comprising:

sum signal generating means (22) for generating the sum signal of said main channel after having performed negative feedback amplification of said FM detected stereophonic composite signal and outputting the generated sum signal in the form of a current signal, subchannel detecting means (300) for detecting said subchannel signal after said negative feedback amplification means has performed negative feedback amplification of said FM-detected stereophonic composite signal and for thereafter outputting the detected subchannel signal in the form of a current signal, difference signal demodulating means (31) for demodulating said difference signal of said detected subchannel signal received from said subchannel detecting means and for thereafter outputting the demodulated difference signal in the form of a current signal, and matrix means (41) for receiving said sum signal from said sum signal generating means and said demodulated, difference signal from said difference signal demodulating means to perform matrix processing of the received sum signal and difference signal and for thereby reproducing said right and left stereophonic signals to output the reproduced right and left stereophonic signals in the form of voltage signals.

2. A stereo demodulator in accordance with claim 1, wherein said sum signal generating means comprises first amplifying means for receiving said FM-detected stereophonic composite signal and performing negative feedback amplification of said signal, and first voltage-current converting means (26) for converting a voltage output signal supplied from said first amplifying means to a current signal and generating said sum signal.

3. A stereo demodulator in accordance with claim 1, wherein said subchannel detecting mean comprises second amplifying means (27) for performing non-inversion negative feedback amplification of the stereophonic composite signal obtained after the negative feedback amplification in said sum signal generating means, third amplifying means (28) for performing inversion negative feedback amplification of the stereophonic composite signal obtained after the negative feedback amplification in said sum signal generating means, second voltage-current conversion means (29, 38) for converting the voltage output signal from said second amplifying means to a current signal and outputting said subchannel signal of a first polarity, and third voltage-current converting means (30, 39) for converting the voltage output signal from said third amplifying means to a current signal and outputting said subchannel signal of a second polarity opposite to said first polarity.

4. A stereo demodulator in accordance with claim 2, wherein said sum signal generating means comprises first operational amplifier (25) for amplifying said FM-detected stereophonic composite signal, a first voltage-current converting transistor (26) for receiving an output of said first operational amplifier at a base thereof and generating at one conduction terminal said sum signal in the form of a current signal, and negative feedback means (24) for connecting another conduction terminal of said first voltage-current converting transistor to an inversion input of said first operational amplifier.

5. A stereophonic demodulator in accordance with claim 3, wherein said subchannel detecting means comprises a second operational amplifier (27) for receiving at its non-inversion input and amplifying an output of an operational amplifier included in said sum signal detecting means, a third operational amplifier (28) for receiving at its inversion input and amplifying the output of the operational amplifier included in said sum signal generating means, a second voltage-current converting transistor (29) for receiving an output of said second operational amplifier at a base thereof and generating at one conduction terminal said subchannel signal of the first polarity in the form of a current signal, another conduction terminal thereof being connected to an inversion input of said second operational amplifier, a third voltage-current converting transistor (30) for receiving an output of said third operational amplifier at a base thereof and generating at one conduction terminal said subchannel signal of the second polarity in the form of a current signal, another conduction terminal thereof being connected to the inversion input of said third operational amplifier through a resistance element (R25), a first current mirror circuit (38) for receiving, as an input signal, the current output signal of said second voltage-current converting transistor, and a second current mirror circuit (39) for receiving, as an input signal, the current output signal of said third voltage-current converting transistor.

6. A stereo demodulator in accordance with claim 1, wherein said difference signal demodulating means comprises current mirror circuitry (34, 37) at its input stage for receiving, as an input signal, the current output signal from said subchannel detecting means.

7. A stereo demodulator in accordance with claim 6, wherein said stereophonic composite signal is a composite signal of a pilot tone system, and said difference signal demodulating means comprises means (40) for providing a signal having a phase locked with that of a pilot signal contained in said stereophonic composite signal and a frequency equal to a carrier frequency of said subchannel, and means (310, 311) for multiplying an output of said signal providing means (40) and an output of the current mirror circuitry in said input stage and outputting said stereophonic difference signal in the form of a current signal.

8. A stereo demodulator in accordance with claim 1, wherein said matrix means comprises third current mirror circuit means (42) for receiving, as an input signal, the current signal from said sum signal generating means, fourth current mirror circuit means (43, 44) for receiving, as an input signal, the current signal from said difference signal demodulating means, and means (N3, N4, R21, R22) for performing addition of output currents from said third and fourth current mirror circuit means and then outputting said right and left stereophonic signals in the form of voltage signals.

9. A method for demodulating right and left stereophonic signals, in a matrix system, from an FM-detected stereophonic composite signal, said stereophonic composite signal including, in a frequency divisionally multiplexed form, a main channel signal obtained by addition of the right and left stereophonic signals and a subchannel signal obtained by carrier-suppressed modulation of a difference signal of the right and left stereophonic signals, said demodulating method comprising the steps of:

performing negative feedback amplification of said FM-detected stereophonic composite signal, generating said main channel signal from the stereophonic composite signal obtained after said negative feedback amplification and outputting the generated main channel signal in the form of a current signal, further performing negative feedback amplification of said stereophonic composite signal after said negative feedback amplification, then generating said subchannel signal and outputting the generated subchannel signal in the form of a current signal, receiving said generated subchannel signal, multiplying by said subchannel current signal a signal locked in phase with a pilot signal included in said stereophonic composite signal and having a frequency equal to a carrier frequency of said subchannel signal, and demodulating and outputting said right and left stereophonic signals in the form of current signals, and performing matrix processing of said main channel current signal and said difference current signals of the right and left stereophonic signals and forming said right and left stereophonic signals.

10. A stereo receiver for reproducing right and left stereophonic signals from a radio-frequency carrier FM stereophonic composite signal including, in a frequency divisionally multiplexed form, a main channel of a sum signal of the right and left stereophonic signals and a subchannel obtained by carrier-suppressed modulation of a difference signal of the right and left stereophonic signals, said stereo receiver comprising:

a radio-frequency amplifier (101) for selectively amplifying a desired high-frequency signal from an incoming signal, a frequency converting amplifier (102) for receiving an output of said radio-frequency amplifier, converting said output to a signal of a predetermined intermediate frequency lower than said radio-frequency and amplifying said intermediate frequency signal, an FM detector (103) for performing FM detection on an output received said frequency converting amplifier and detecting a desired stereophonic composite signal, and a stereo demodulator (200) for reproducing the right and left stereophonic signals with a matrix system from an output received from said FM detector, said stereo demodulator comprising sum signal generating means (22) for generating the sum signal of said main channel after having performed negative feedback amplification of said FM-detected stereophonic composite signal, and outputting the generated sum signal in the form of a current signal, subchannel generating means (300) for generating said subchannel signal after said negative feedback amplification means has performed negative feedback amplification of said FM-detected stereophonic composite signal and for thereafter outputting the generated subchannel signal in the form of a current signal, difference signal demodulating means (31) for demodulating said difference signal of the current signal received from said subchannel generating means and for thereafter outputting the demodulated difference signal in the form of a current signal, and matrix means (41) for receiving said sum signal from said sum signal generating means and said demodulated difference signal from said difference signal demodulating means, performing matrix processing of the received sum signal and difference signal and for thereby reproducing said right and left stereophonic signals, and outputting the reproduced right and left stereophonic signals in the form of voltage signals.

* * * * *